(12) United States Patent
Schäffer et al.

(10) Patent No.: US 6,391,217 B2
(45) Date of Patent: May 21, 2002

(54) METHODS AND APPARATUS FOR FORMING SUBMICRON PATTERNS ON FILMS

(75) Inventors: Erik Schäffer, Noordwolde (NL); Jurgen Mlynek, Radolfzell (DE); Ullrich Steiner, Groningen (NL); Thomas Thurn-Albrecht, Freiburg (DE); Thomas P. Russell, Amherst, MA (US)

(73) Assignees: University of Massachusetts, Boston, MA (US); Universitat Konstanz, Konstanz (DE)

( * ) Notice: Subject to any disclaimer, the term of this patent is extended or adjusted under 35 U.S.C. 154(b) by 0 days.

(21) Appl. No.: 09/746,667

(22) Filed: Dec. 22, 2000

Related U.S. Application Data

(60) Provisional application No. 60/173,001, filed on Dec. 23, 1999.

(51) Int. Cl.[7] ............................................. B44C 1/22
(52) U.S. Cl. ..................... 216/41; 264/485; 427/457; 427/458; 428/161
(58) Field of Search ..................... 216/41; 428/161; 427/457, 458

(56) References Cited

U.S. PATENT DOCUMENTS 4,119,688 A * 10/1978 Hiraoka ...................... 264/485

OTHER PUBLICATIONS

Aharoni–Hazan et al., "Electric field induced pattern formation in interfacial metal colloid films", Physica A 200, 1993, p. 189–199.*
Stephen Y. Chou et al., Lithographically Induced Self-Construction of Polymer Microstructures for Resistless Patterning, Applied Physics Letters, 75:7:1004–1006, Aug. 16, 1999.
K. Dalnoki–Veress et al., "Dispersion–Driven Morphology of Mechanically Confined Polymer Films," Physical Review Letters, 82:7:1486–1489, Feb. 15, 1999.
Robert F. Service, "Patterning Plastic With Plentiful Pillars," Science, vol. 286, p. 1067, Nov. 5, 1999.
Böltau et al., "Surface–Induced Structure Formation of Polymer Blends on Patterned Substrates," Nature, MacMillan Journals Ltd. London, GB, 391:6670:877–879, Feb. 26, 1998.

* cited by examiner

Primary Examiner—Frankie L. Stinson
Assistant Examiner—Shamim Ahmed
(74) Attorney, Agent, or Firm—Fish & Richardson P.C.

(57) ABSTRACT

A method for forming a patterned film on a substrate, the method including: providing a first flowable medium on the substrate and a second flowable medium on the first flowable medium, the first and second flowable media having different dielectric properties and defining an interface there between; applying an electric field to the interface for a time sufficient to produce a structure in the first flowable medium along the interface; and hardening the structure in the first flowable medium to form the patterned film.

26 Claims, 8 Drawing Sheets

METHODS AND APPARATUS FOR FORMING SUBMICRON PATTERNS ON FILMS

CROSS-REFERENCE TO RELATED APPLICATION

This application claims benefit from U.S. provision application No. 60/173,001, filed on Dec. 23, 1999, which is incorporated herein by reference in its entirety.

FIELD OF THE INVENTION

The invention relates to methods and apparatus for producing submicron patterns on films. This invention was made with government support under NSF #DMR-9809365. and DOE #DE-FG02-96ER45612. The government has certain rights in this invention.

BACKGROUND OF THE INVENTION

In the microelectronics, biotechnology, adhesive, and microsystem industries, it is important to produce high-resolution patterns on substrates. For examples, such high-resolution patterns are necessary to produce integrated circuits. Limits on the resolution of such patterns limit the performance of such integrated circuits. Presently, microlithography is commonly used to produce patterns on substrates. Microlithography techniques involve exposing a photoresist to an optical pattern, and using chemicals to etch either the exposed. or unexposed, portions of the photoresist to produce the pattern on the substrate. The resolution of the pattern is thus limited by the wavelength of light used to produce the optical pattern.

SUMMARY OF THE INVENTION

The present invention relates to a technique for producing lithographic structures by exposing at least one film on a substrate to an externally applied electric field, such as that produced within a parallel plate capacitor. The externally applied electric field produces forces in the film that cause mass transfer in the film to thereby produce a lithographic pattern. The resolution of the pattern will depend on the magnitude of the electric field, and the dielectric constant, surface energy, and the viscosity of the film. The pattern can be further specified by spatially controlling the electric field, e.g., by using patterned electrodes in the capacitor. The pattern can also be further specified by spatially varying the surface energy of the film.

In general, in one aspect, the invention features a method for forming a patterned film on a substrate. The method includes providing a first flowable medium on the substrate and a second flowable medium on the first flowable medium. The first and second flowable media have different dielectric properties and define an interface between them. The method further includes applying an electric field to the interface for a time sufficient to produce a structure in the first flowable medium along the interface, and hardening the structure in the first flowable medium to form the patterned film.

Embodiments of the invention can include any of the following features.

For example, the first flowable medium can be a liquid, and the second flowable medium can be another liquid, or a gas at any pressure. Furthermore, the hardening can include: initiating a chemical reaction in the first flowable medium; polymerizing the first flowable medium; or cross-linking the first flowable medium.

To create a selected pattern, the application of the electric field can include laterally varying the strength of the electric field along the interface to define the structure. Furthermore, the method can include providing the substrate with a laterally varying surface energy to further define the structure. Alternatively, the method can include providing the substrate with a laterally varying surface energy to further define the structure, without laterally varying the strength of the electric field along the interface.

The substrate can include a lower electrode and the application of the electric field can include applying a voltage across the lower electrode and an upper electrode spaced from the lower electrode by at least the first and second flowable media. Furthermore, to laterally vary the strength of the electric field along the interface, the method can involve any of the following: at least one of the upper and lower electrodes can have a topography that defines a laterally varying separation between the electrodes; at least one of the upper and lower electrodes can include multiple, lateral regions having different conductivities; and the substrate can include a layer of non-conductive material positioned between the lower electrode and the first flowable medium, wherein the layer of non-conductive material includes multiple, lateral regions having different dielectric properties. Moreover, the substrate can include multiple, independently addressable lower electrodes and/or there can be multiple, independently addressable upper electrodes, to thereby laterally vary the strength of the electric field along the interface. For example, the application of the external electric field can include generating multiple, potential differences between one or more of the lower electrodes and one or more of the upper electrodes.

More generally, when the substrate includes a lower electrode, the substrate can include a layer of non-conductive material positioned between the lower electrode and the first flowable medium. Furthermore, the upper electrode can be spaced from the second flowable medium by a layer of non-conductive material. That layer of non-conductive material may include multiple, lateral regions having different dielectric properties, to laterally vary the strength of the electric field along the interface.

The method can further include separating the upper electrode and the second flowable medium from the hardened lateral structure to reveal the patterned film. Also, the method can be repeated to form multiple patterned films on the substrate.

Furthermore, the method can be used for microlithography. For example, the patterned film can expose selected regions of the substrate and the method can further include removing a layer of the substrate at each of the exposed regions. Also, the patterned film can expose selected regions of the substrate and the method can further include depositing a layer of material at each of the exposed regions of the substrate.

In another aspect, the invention features the patterned film produced by the method.

In general, in another aspect, the invention features a method for producing a pattern on multiple substrates. Each of the multiple substrates has at least one lower electrode. The method includes: providing a master defining the pattern, the master including at least one upper electrode; providing a first flowable medium on one of the substrates; positioning the master above the first flowable medium spaced from the first flowable medium by at least a second flowable medium, the first and second flowable media having different dielectric properties and defining an interface there between; applying a voltage across at least one of the lower electrodes and at least one of the upper electrodes for a time sufficient to produce a structure in the first flowable medium along the interface; hardening the lateral structure in the first flowable medium to form the pattern; and using the same master, repeating the second providing step, the positioning step, the generating step, and the hardening step for additional ones of the substrates.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, suitable methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

The techniques disclosed herein can include many advantages. For example, the patterns are produced without optical radiation, and therefore their resolution is not limited by the wavelength of optical radiation. In principle, the lateral resolution of the pattern can be made arbitrarily small by controlling the externally applied electric field and selecting a film with appropriate properties. Furthermore, the techniques can produce high-resolution patterns on the film, without requiring the use of chemicals to etch or remove portions of the film.

Other features and advantages of the invention will be apparent from the following detailed description, and from the claims.

BRIEF DESCRIPTION OF THE DRAWINGS

FIGS. 2a, 2b, and 2c are schematic drawings of the formation of a patterned film using the apparatus of FIG. 1a.

FIGS. 3a, 3b, and 3c are schematic drawings of the formation of a patterned film using a modified version of the apparatus of FIG. 1a.

FIGS. 4a and 4b are schematic drawings of the formation of a patterned film using a another modified version of the apparatus of FIG. 1a.

DETAILED DESCRIPTION

The invention features a method for producing a microlithographic pattern, e.g., a patterned film on a substrate. The method involves exposing the interface between a first flowable medium and a second flowable medium to an externally applied electric field for a time sufficient to form a pattern in the first flowable medium, and hardening the first flowable medium to retain the pattern in the absence of the externally applied electric field and form the patterned film. The electric field can be applied by placing the flowable media in a capacitive device, e.g., between two electrodes having a potential difference. The flowable media respond to local variations in the externally applied electric field along the interface and local variations in the surface energy of an electrode, or any intermediate layer, contacting them. Accordingly, a selected pattern can be mapped onto either flowable medium by controlling such parameters.

Figure 1A:
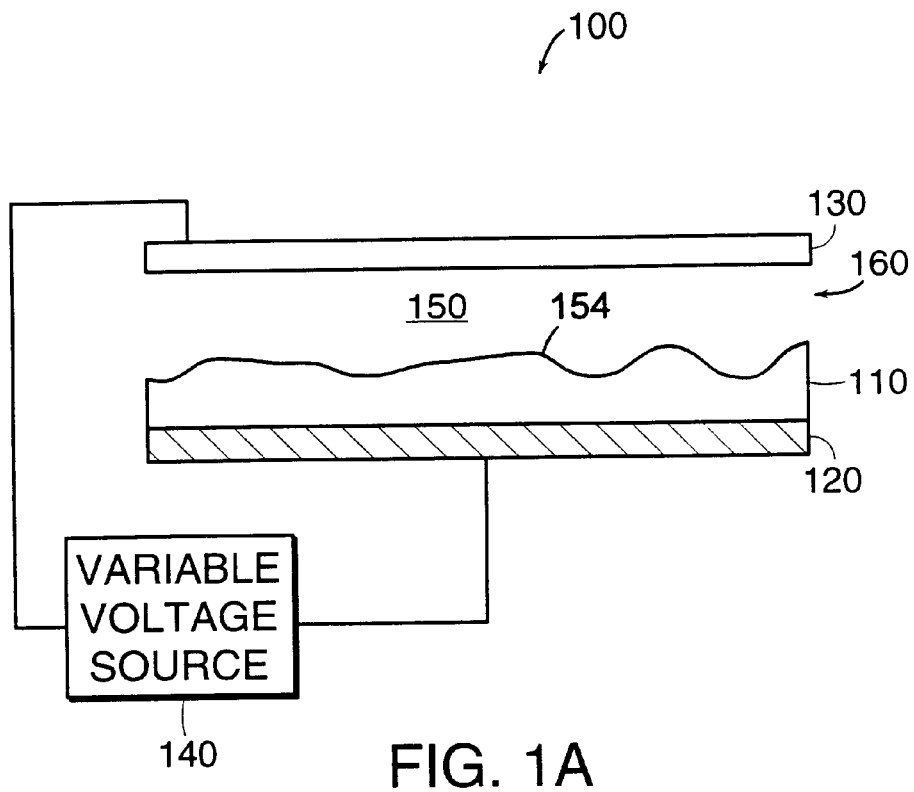
FIGS. 1a and 1b are schematic drawings of an apparatus for forming a patterned film.

An apparatus 100 for producing the patterned films is shown in FIG. 1a. A film 110 formed on a substrate 120, is spaced from an upper electrode 130 by a gap 152 filled with a second material 150. The second material can be any of a gas at any pressure (e.g., air), a liquid, and a flowable plastic. While the second material is typically a dielectric, it can also be conductive or semiconductive. At least a portion of substrate 120 is conductive and defines a lower electrode. For example, the substrate can be a semiconducting wafer. The first and second electrodes are connected to a variable voltage source 140, which during operation produces an externally applied electric field between the electrodes.

Film 110 and second material 150 define an interface 154 that is responsive to a Laplace pressure (e.g., surface tension), which tends to stabilize the interface. In the presence of the externally applied electric field, however, a difference in dielectric constant across the interface gives rise to an electrostatic pressure, which is opposed by the Laplace pressure and a disjoining pressure and destabilize the interface. When film 110 and second material 150 are each in a state that permits them to flow relative to one another, the structure of the film at the interface can deform in response to the electrostatic pressure and produce a lateral structure. For example, such flowable media include gases, liquids, glasses, and flowable plastics such as teflon.

Typically film 110 is a dielectric material including, e.g., a dielectric polymer or oligomer. For example, the film can be a glassy or semi-crystalline polymer (e.g., polystyrene), which is spin-coated onto substrate 120. Other suitable polymers for the film include polymethylmethacrylate (PMMA), brominated polystyrene (PBrS), and polyisoprene. Suitable oligomers include styrene and dimethylsiloxane. Such polymers and oligomers are also suitable for the second material in the gap, provided it is different from the film material. Preferably, the film is liquified when exposed to the externally applied field. The film can be liquified by, e.g., heating (i.e., annealing) it or exposing it to a solvent or a solvent atmosphere. For example, when the film is a glassy or semi-crystalline polymer, it may be solid at room temperature and turn liquid upon heating. Alternatively, liquifying the film may not be necessary because, e.g., the film may already be a liquid or may be sufficiently flowable to respond to the electrostatic pressure imparted by the externally applied electric field. In addition to being a dielectric material, the film can also be conductive or semiconductive material. However, when either film 110 or second material 150 is conductive, substrate 120 or upper electrode 130 may include a non-conductive layer to prevent shorting between the electrodes. Such additional layers may also be desirable even when film 110 and second material 150 are not both conductive.

Figure 1B:
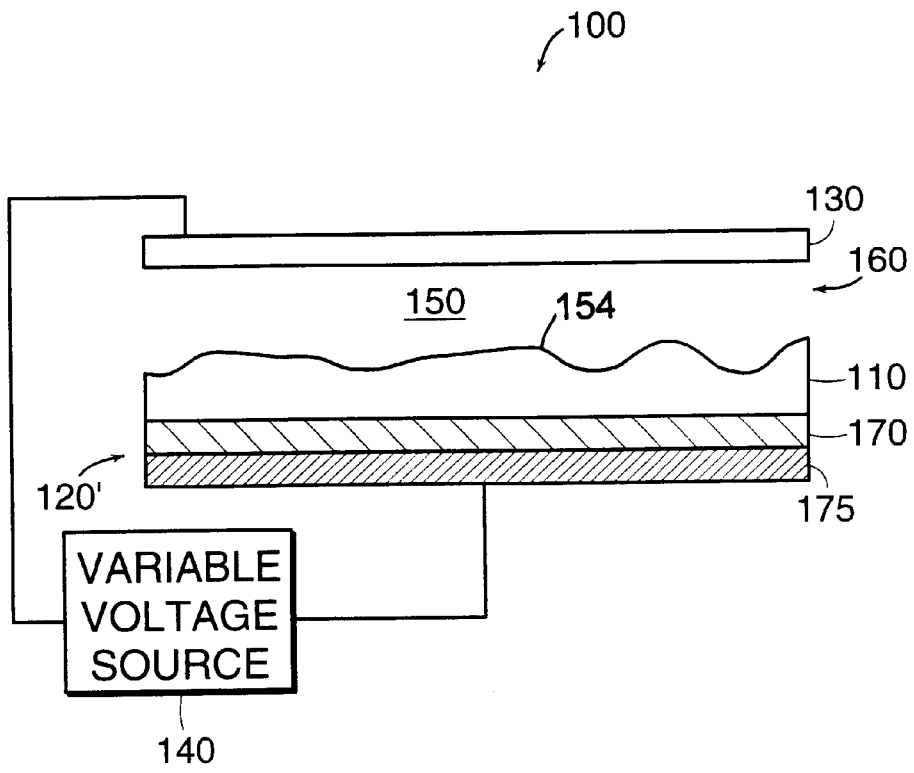

For example, in the embodiment shown in FIG. 1b, substrate 120' includes a nonconductive layer 170 and a conductive layer 175 defining the second electrode. In the description that follows, the embodiment of FIG. 1a is assumed, but the description is applicable to the embodiment of FIG. 1b as well. Furthermore in additional embodiments, film 110 may include a plurality of dielectric, conducting, or semiconducting layers. The voltage source 140 can be an AC source or a DC source.

Figure 2A:
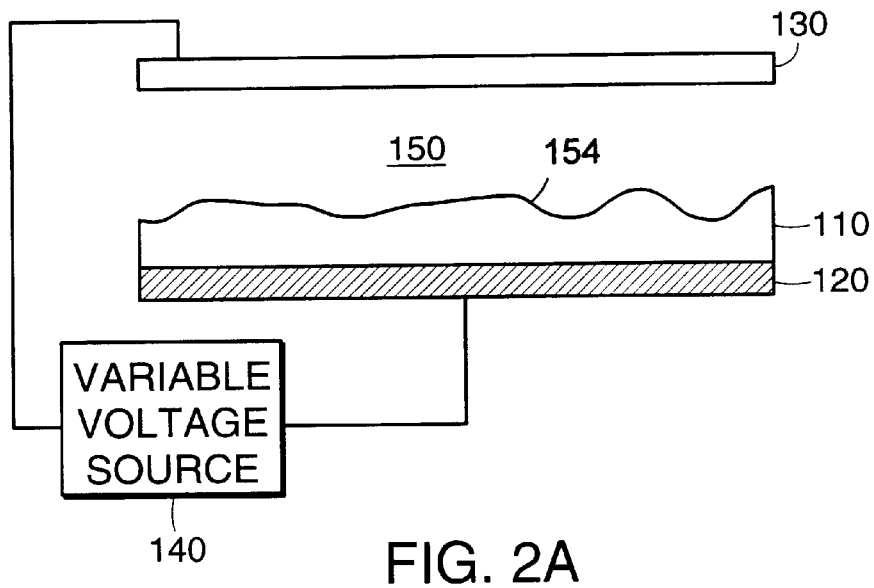
Figure 2B:
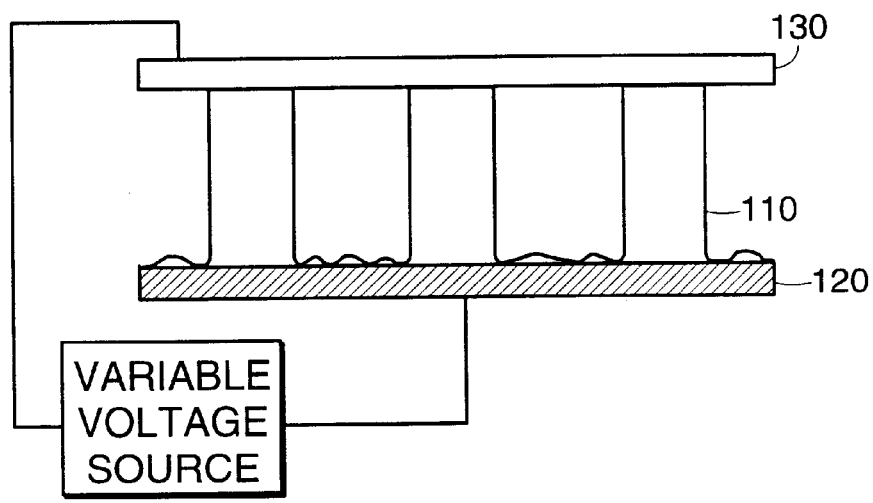
Figure 2C:
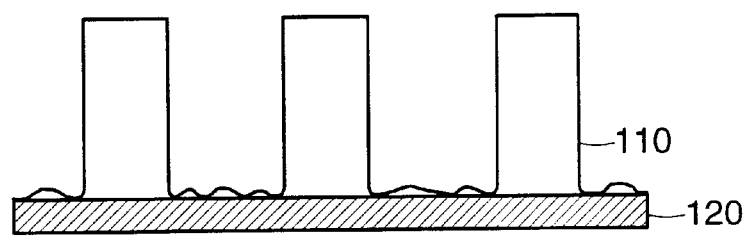

When a voltage is applied to the electrodes, the resulting electric field between the electrodes 120 and 130 will induce a dipole field at the dielectric interface between film 110 and gap 160, which will ultimately destabilize the dielectric film and dominate over competing forces. The film develops a surface undulation with a well-defined wavelength, as shown in FIG. 2a. With time, the amplitudes of these waves increase until film 110 touches electrode 130, as shown in FIG. 2b, thereby producing a columnar structure having well-defined column diameters and inter-column spacing forms. By hardening or solidifying the film material, the structure is preserved, as shown in FIG. 2c. For example, to preserve the structure, the film can be ordered (e.g., crystallized) by reducing temperature and/or adjusting pressure, it can also be solidified by any of a chemical reaction, a cross-linking process, a polymerization reaction, and a sol-gel process.

The column diameter and spacing depend on parameters such as the potential difference between the upper and lower electrodes, the electrode spacing, the dielectric properties of film 110 and material 150, and the Laplace pressure of the film (e.g., the surface tension for the case of gap 160 being a gas).

Figure 3A:
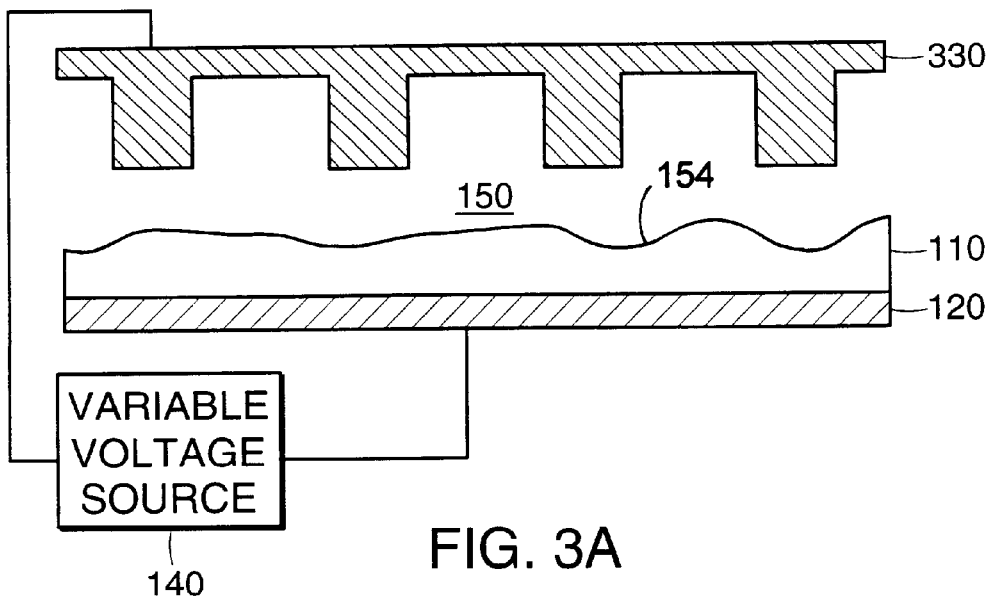
Figure 3B:
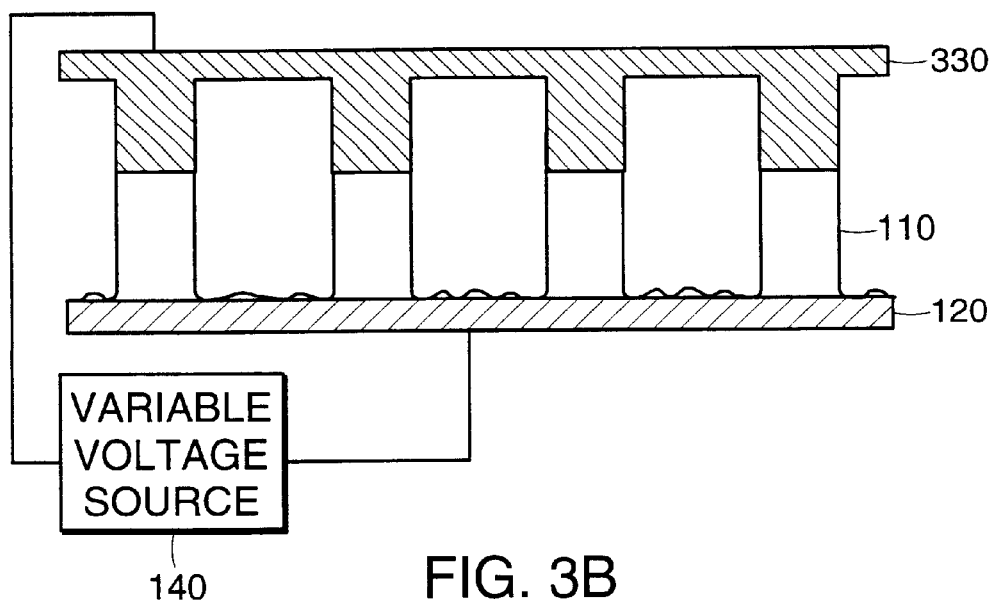
Figure 3C:
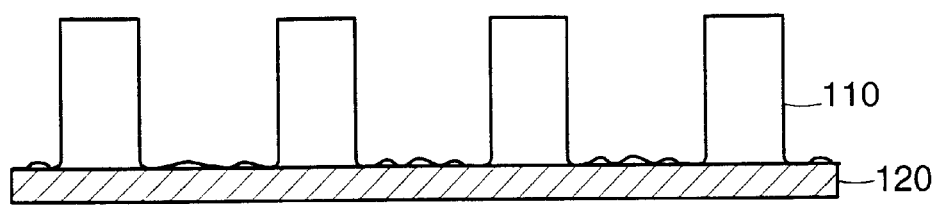

The embodiment described in FIGS. 2a–2c corresponds to a device formed by a laterally homogeneous, externally applied electric field. In a laterally heterogeneous electric field, the electrically induced instability of the dielectric film 110 is additionally modified by the lateral gradients of the electric field. This effect can be used to replicate a master pattern to a lateral structure in the dielectric film. To this end, one or both electrodes can feature a lateral pattern. Such electrode patterns can be produced, for example, by electron beam etching. Such an embodiment is shown in FIG. 3a, where upper electrode 130 is replaced with upper electrode 330, which is topographically patterned. In this case, the externally applied field causes the film undulations to focus in the direction of the electric field gradient, i.e., in the direction of increasing electric fields. As a result, the dielectric film forms a pattern corresponding to the topographically patterned electrode 330, as shown in FIG. 3b. Upon solidifying the dielectric film, the columnar structure is retained, as shown in FIG. 3c. In addition, the aspect ratio of the patterned film can be significantly greater than that of the patterned electrode. To increase the aspect ratio, the spacing between the upper electrode and the substrate is increased, while the film is liquified and the voltage is applied. If necessary, the voltage can be varied during the relative displacement of the electrode and the substrate. Furthermore, in other embodiments, the lower electrode can also be patterned, either in the alternative, or in addition, to the upper electrode.

The embodiment shown in FIGS. 3a–c provides one example of how one can laterally vary the strength of the electric field along interface 154 to define the lateral structure. In another example, the electric field strength along the interface can also be made to vary laterally by providing one or both electrodes with multiple, lateral regions having different conductivities. For example, the composition of one or both of the electrodes can vary laterally (e.g., separate lateral regions containing different metals). Furthermore, one can vary the electric field strength at the interface by introducing a layer having a lateral variation in dielectric material between the upper and lower electrodes. Finally, rather than using a single upper electrode and a single lower electrode, one can laterally vary the electric field strength by using multiple, independently addressable electrodes to generate multiple voltage differences across the interface between different pairs of the electrodes. Embodiments of the invention may include any one or any combination of such techniques to laterally vary the electric field strength along the interface and thereby provide a template for the formation of the lateral structure.

Figure 4A:
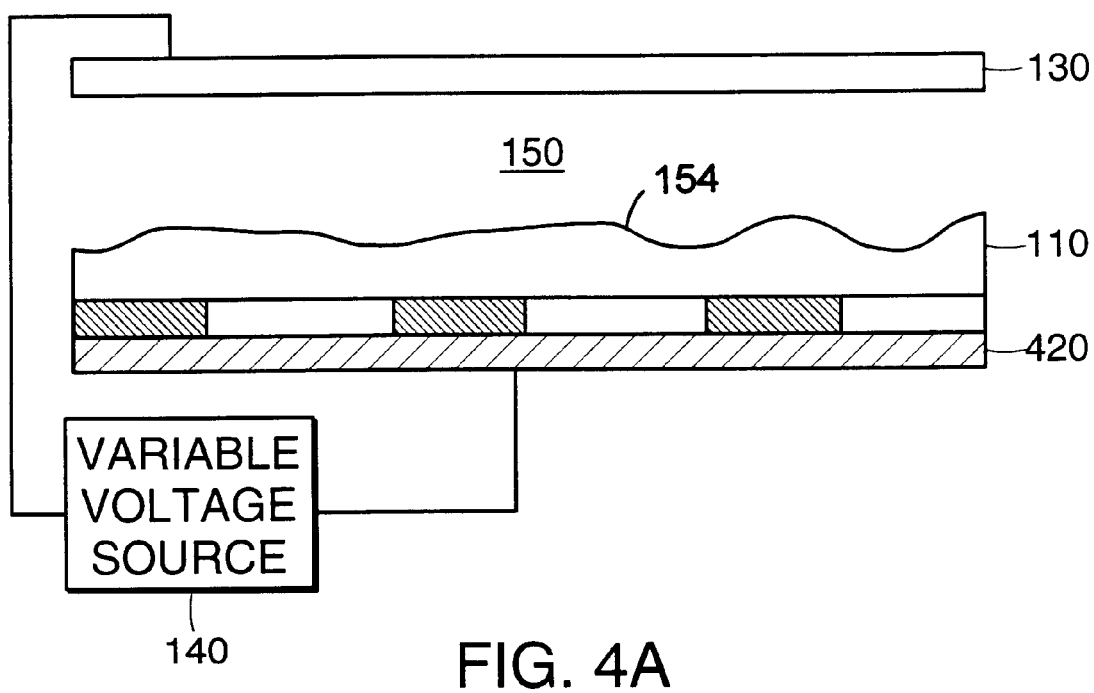
Figure 4B:
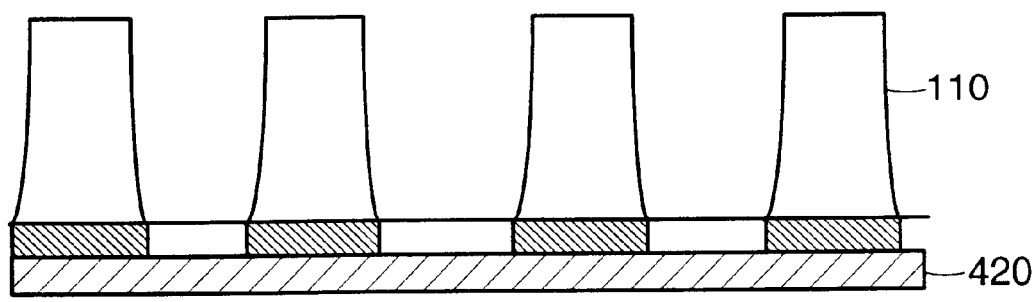

In a further embodiment, shown in FIG. 4a, substrate 120 is replaced with substrate 420, which has a lateral variation in its surface energy. The lateral variation in surface energy can be produced, for example, by micro-contact printing, electron or ion-beam etching, and patterned deposition of any of, e.g., perfluorinated materials, metals, and self-assembled alkane thiols. Thereafter, film 110 is deposited onto substrate 420. As in the other embodiments, the film is liquified and a voltage is applied to the electrodes. The electric field results in an instability of the dielectric film, as described above. The developing surface undulations align with respect to the surface energy pattern of the substrate. This structure in the dielectric film is again preserved in the absence of the electric field by solidifying the polymer, as shown in FIG. 4b. Alternatively, in other embodiments, electrode 130 and adjacent gap 160 can have a lateral variation in surface energy, either in the alternative, or in addition, to electrode 420. In further embodiments, it is also possible to have a lateral variation in the surface energy of one or both of the electrodes, and a topographical pattern on one or both of the electrodes, and/or any other combination of the techniques described above for laterally varying the electric field strength along the interface.

In any of the embodiments described above, the upper electrode can be treated with a release agent to facilitate its removal from the solidified, patterned film. For example, using techniques known in the art, a self-assembled alkane monolayer can be formed on the top electrode prior to use to facilitate such removal.

Although not meant to limit the invention in any way, the following discussion may provide theoretical guidance for the above and additional embodiments of the invention.

Theoretically, the origin of the film instability can be understood when considering the balance of forces, which act at the interface. The interfacial forces (e.g., surface tension γ) minimize the interfacial surface area and stabilize the homogeneous film. The electric field, on the other hand, polarizes the film resulting in an effective displacement charge density at the liquid-air interface, which destabilizes the film. When written in terms of pressures, the electrostatic pressure $p_{el}$ opposes the Laplace pressure. A local perturbation in the film thickness results in a pressure gradient that drives a flow of the film liquid in the plane of the film. The liquid flow next to a solid surface is given by a Poiseuille type formula, which, together with a mass conservation equation, establishes a differential equation describing the temporal response of the liquid. A common approach to investigate the effect of external forces on a liquid film is the linear stability analysis. A small sinusoidal perturbation is applied to an otherwise flat film and its response is calculated with the help of a linearized version of the differential equation. The resulting dispersion relation quantifies the decay or amplification of a given perturbation wavelength with time. The fastest amplified mode is given by:

$$\lambda_m = 2\pi \sqrt{\frac{2\gamma}{\left(\frac{\partial p_{el}}{\partial h}\right)}} \quad (1)$$

in which $\lambda_m$ is the wavelength of the mode and corresponds to the resolution of the formed pattern, $p_{el}$ is a function of the electric field and the dielectric constant of the film, and h is the thickness of the film.

Figure 5:
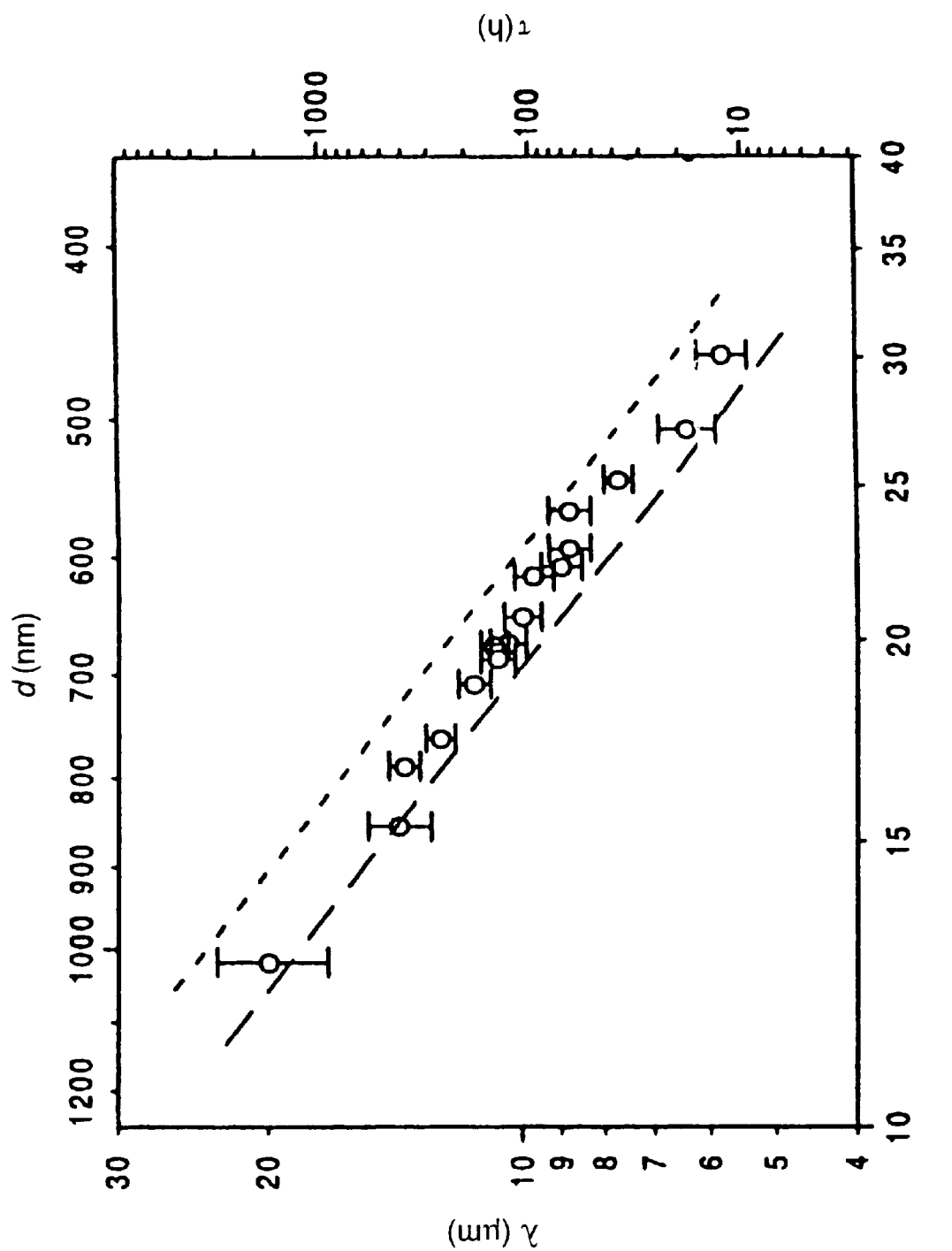
FIG. 5 is a graph of theoretically determined values of the wavelength $\lambda$ of the patterned film and the characteristic time $\tau$ of the pattern formation for a liquid-air interface.

The dotted and dashed lines in FIG. 5 show $\lambda_m$ as a function of the electric field for slightly different models of the electrostatic pressure $p_{el}$. A similar equation quantifies the characteristic time $\tau_m$ for the formation of the instability (right hand axis in FIG. 5). The experimental data shown in FIG. 5 will be described further below.

For the limit of a vacuum gap separating the upper electrode from the film, expressions for $\lambda_m$ and $\tau_m$ can further be expressed as:

$$\lambda_m = 2\pi \sqrt{\frac{\gamma}{\varepsilon_0} \cdot \left(\frac{\varepsilon d}{\varepsilon - 1} - h\right)^{\frac{3}{2}} \cdot \frac{1}{U}} \quad (2)$$

$$\tau_m = \frac{3\eta\gamma}{\varepsilon_0^2} \cdot \frac{1}{h^3} \left(\frac{\varepsilon d}{\varepsilon - 1} - h\right)^6 \cdot \frac{1}{U^4} \quad (3)$$

where the applied voltage between the electrodes is U, the surface energy of the film is $\gamma$, the dielectric constant of the film is $\in$, the film viscosity is $\eta$, and the plate separation is d. In general, the equations indicate that no features are formed without the presence of the externally applied field. They also indicate that the resolution of the pattern is arbitrarily small because, in principle, d, h, and U can be arbitrarily controlled. For example, non-conductive spacers can be used to precisely control the electrode spacing. For suitable parameters, the electric field is typically in the range of about $10^7$ V/m, and the time required to produce small features is sub-second. Furthermore, if desired, the surface energy of the film can be adjusted by introducing materials such as surfactants or block copolymers, or additives that increase or decrease the surface energy.

Figure 6:
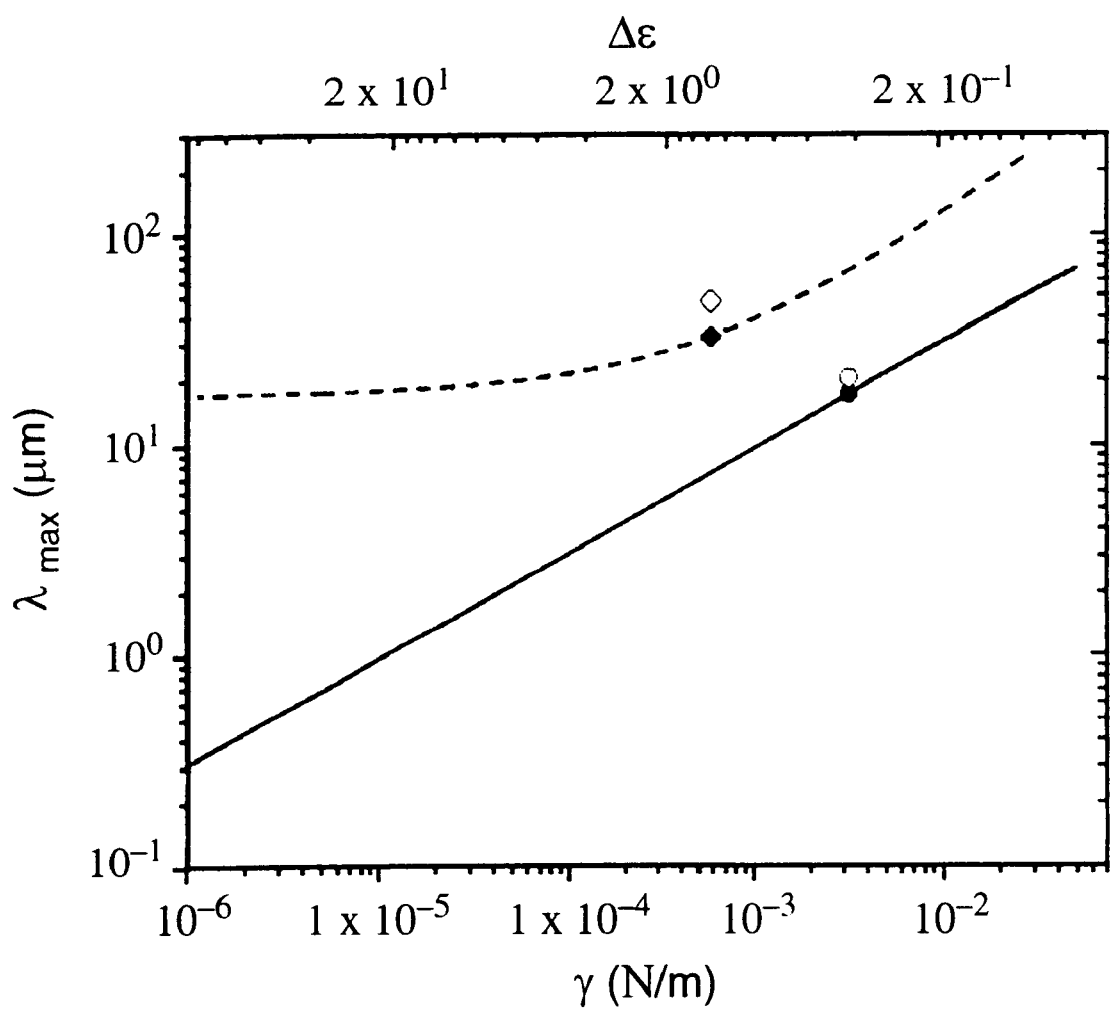
FIG. 6 is a graph of theoretically determined values of the wavelength $\lambda$ of the patterned film for a liquid-liquid interface.

For the case of a liquid material separating the film from the upper electrode, the difference in dielectric constant across the interface decreases, which would tend to increase the value for $\lambda_m$. In practice, however, this is more than compensated by a decrease in the Laplace pressure for a liquid-liquid interface versus a liquid-air interface. For example, a typical Laplace pressure for a liquid-air interface is about 30 dynes/cm$^2$, whereas the Laplace pressure for a water-oil interface is about 1 dynes/cm$^2$. This is explained with further reference to FIG. 6. The dependence of $\lambda_m$ on the dielectric constant difference between the liquids, i.e. $\Delta\in=\in_1-\in_2$, while keeping other variables constant, is shown in FIG. 6 (dashed line, left and top axis). $\lambda_m$ diverges at the point where the dielectric constants of the two media are equal, i.e. $\Delta\in=0$. This is understandable since the polarizabilities of the liquids are equal and the electric field does not exert any pressure on the liquid/liquid interface. The solid line (left and bottom axis) of FIG. 3 illustrates a simple route to achieve smaller sized structures. These results show the scaling of $\lambda_m$ as a function of the interface or surface tension. It is seen that $\lambda_m \sqrt{\gamma_{12}}$. As described above, a strategy to reduce $\gamma_{12}$ is by the addition of a small amount of a diblock-copolymer that segregates to the liquid/liquid interface. Similarly one can achieve an effective reduction of the surface tension of a single layer by placing a surfactant or any additive that reduces $\gamma_{12}$ at the liquid/air interface. One consequence of the reduction in $\gamma_{max}$ for the bilayer is a dramatic decrease in time required to amplify fluctuations. Intuitively, one would expect that the presence of the second viscous medium would slow the growth of fluctuations substantially. On the contrary, experimental results (described in further detail in Example 3) show a 50-fold reduction in this characteristic time relative to a liquid-air structure.

While the topography of the film occurs spontaneously, control of the lateral structure is achieved by laterally varying the electric field strength at the interface as described above. For example, recall that the upper electrode can be replaced by a topographically patterned master, as described in reference to FIGS. 2a–2c. Because the electrostatic forces are strongest for smallest electrode spacings d, the time for the instability to form is much shorter for smaller values of d (see FIG. 5, right hand axis). As a consequence, the emerging structure in the film is focused towards the electrode structure. This leads to a replication of the master electrode.

In general, embodiments of the invention exploit the use of electrostatic forces to act on a dielectric boundary. If the inter-electrode spacing is chosen small enough (<1 μm), small applied voltages (~30 V) are sufficient to generate high electric fields ($10^7$–$10^8$ V/m) in the dielectric film. This results in strong pressures that act on the dielectric boundary (~10 kN/m$^2$). These forces cause the break-up of the dielectric film. For a laterally homogeneous electric field, the film instability features a characteristic wavelength, which is a function of the electric field strength and the dielectric constant of the film and is well described by a linear stability analysis. If one of the electrodes is replaced by a patterned master, the electrode structure is replicated by the dielectric medium. As described in the experimental results below, lateral length scales down to 140 nm and aspect ratios close to 1 have been created. The extension to lateral length scales of less than 100 nm and aspect ratios greater than 1 are possible.

The patterning methods disclosed herein can have many applications.

For example, the methods can be used in microlithographic applications where the patterned film is formed on the substrate as a mask to selectively expose some regions of the substrate and not others. Once formed, the pattern can be transferred to the subtstrate by removing a layer of the substrate at each of the exposed regions, e.g., by chemical or reactive ion etching techniques. Alternatively, a layer of material can be deposited onto the patterned substrate to fill the exposed regions. For example, the exposed regions can be filled with metal to provide wires within an integrated circuit.

Furthermore, using the techniques disclosed herein, multiple patterned films can be built up on a single substrate. For example, an additional layer can be deposited over the first pattered film to immobilize it during subsequent pattern formation above the additional layer. Moreover, in addition to being a mask for microlithographic applications, the patterned films may themselves provide functionality for any multilayer structure formed using the methods disclosed herein. For example, the patterned film can be a patterned semiconducting layer in an integrated circuit.

The patterning techniques disclosed herein are not limited to the fabrication of integrated circuits. They can also be used to form single or multiple patterned surfaces as part of, e.g., a display device or a chemical, biological, medical, or mechanical sensor.

Returning again to microlithography applications, the methods disclosed herein include many advantages over conventional photolithography techniques. In such techniques, optical radiation passes through a mask or reticle to expose selected regions of a photoresist layer deposited on a substrate. Typically a wet chemical etch follows to remove either the exposed or unexposed regions of the photoresist and thereby produce a patterned film on the substrate. In contrast, the techniques disclosed herein do not require a wet chemical etch to form the patterned film, instead the externally applied electric field causes mass transfer of the film material to form the pattern. As result, problems commonly associated with wet etching, such as under exposure or undercutting due to over exposure are avoided.

Furthermore, the techniques disclosed herein do not require the optical exposure tools necessary in photolithography. Moreover, the resolution of the techniques are not limited by any optical diffraction or scattering constraints. To the contrary, a single master electrode having a topography with resolution better than the diffraction-limited resolution of photolithography tool can be produced by, e.g., electron beam etching, and then, using the techniques disclosed herein, the master electrode can be used multiple times to reproduce the high-resolution pattern on as a film on each of multiple substrates.

EXAMPLES

The invention will now be illustrated by way of the following nonlimiting examples.

Example 1—Homogeneous Field

A thin polymer film of polystyrene (PS) of thickness h was spin-coated from solution onto a highly polished silicon wafer serving as one of the electrodes. Subsequently, another silicon wafer was mounted as the opposing electrode at a distance d leaving a thin air gap. The assembly was then heated above the glass transition temperature of the polymer ($T_g$) and a small voltage U (20–50 V) was applied. To assure the air gap, the top electrode had a small step. Using a wedge geometry, a range of d values could be achieved, while locally maintaining a nearly parallel electrode configuration. Air gaps ranging from 100 nm to 1000 nm were achieved in this way. The voltage and the geometry of the capacitor device determine the electric field. The electrostatic driving force scales with the difference of the electric fields in the polymer film, $E_p$, and the air gap. $E_p$ increases with decreasing values of d and increasing polymer film thickness h. The low applied voltage combined with the small distance between the electrodes (d<1 $\mu$m) leads to high electric fields $E_p$ ($10^7$–$10^8$ V/m). The electric filed caused a small current to flow through the device (10–50 mA/cm$^2$). At high electric fields the current is caused by an ion conduction mechanism mediated by small impurity molecules in the polymer matrix. After exposing the heated film to the applied voltage for a time ranging from several minutes to a few hours, the polymer was subsequently immobilized by quenching below $T_g$, the top electrode was mechanically removed, and then the morphology of the polymer film was investigated by optical and atomic force microscopy (AFM).

Figure 7A:
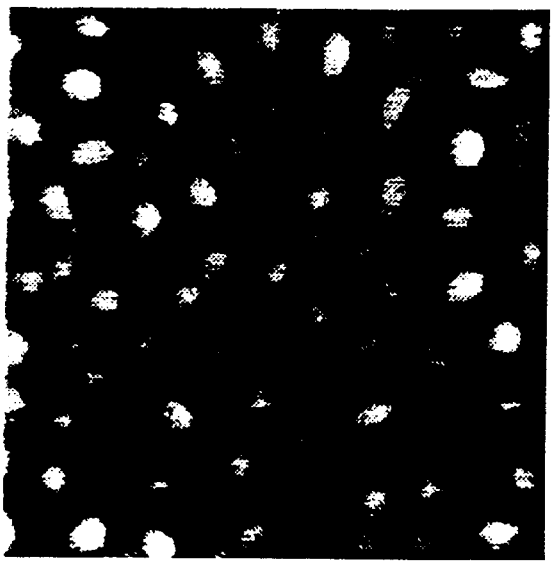
FIGS. 7a, 7b, 7c, and 7d are optical micrographs of polystyrene patterned films produced using a homogeneous externally applied electric field.
Figure 7B:
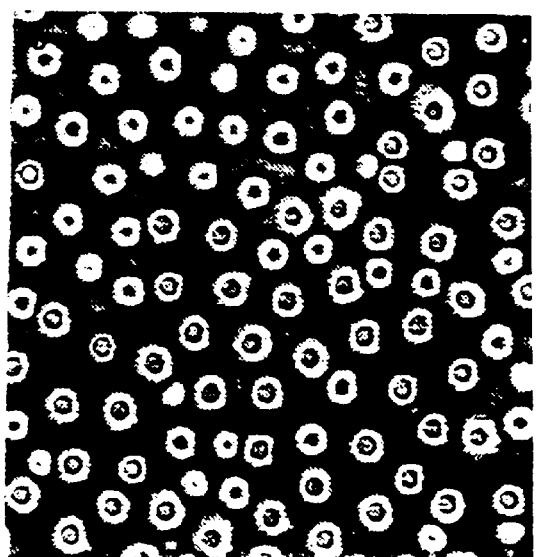
Figure 7C:
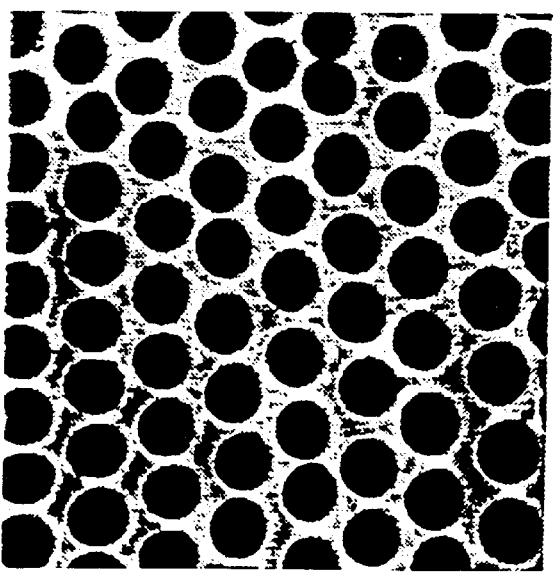
Figure 7D:
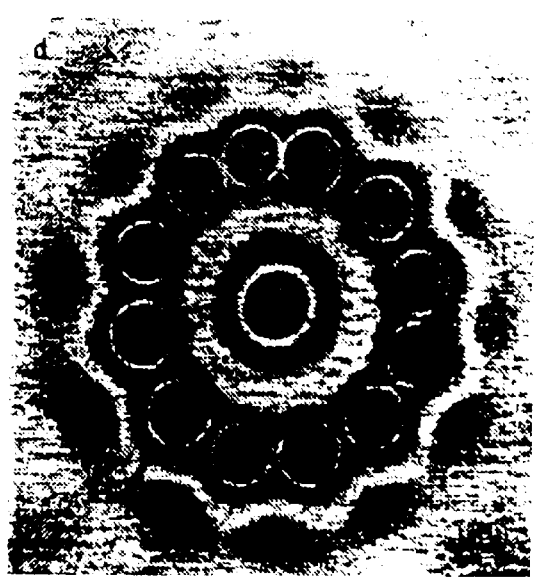

The results of the experiment are shown in FIGS. 7a–7d, which are optical micrographs of polystyrene (PS) films that were exposed to an electric field. In FIGS. 7a and 7b, a 93 nm thick PS film was annealed for 18 hours at 170° C. with an applied voltage U=50 V. In FIGS. 7c and 7d, the film thickness was increased to 193 nm. Depending on the electric field strength and the exposure time, either surface undulations (FIG. 7a) or a columnar structure where the liquid bridges the gap between the electrodes (FIG. 7b) were observed. Because the two electrodes were not perfectly parallel, the electric field also exhibits a small lateral variation.

Qualitatively, different degrees of ordering were observed. The ordering phenomenon originates from the repulsion of the equally charged undulation maxima and minima. While the film morphology in FIG. 7b exhibits only imperfect order, more complete hexagonal packing was achieved in FIG. 7c. The main difference between the two images is the initial thickness h of the polymer film. With otherwise similar parameters, this increased thickness leads to a more dense lateral arrangement of the polymer columns and to an increased column-column repulsion. As a consequence, an improved hexagonal order was observed in FIG. 7c compared to FIG. 7b.

While nearest neighbor interactions lead to a hexagonal symmetry, second order effects can be observed as well, as demonstrated for the nucleated instability in FIG. 7d. The locally higher value of h at the nucleation point leads to a higher electric field and an increased driving force. This caused a depletion of the nearest-neighbor undulations. The next-nearest neighbors, on the other hand, were again amplified. They formed a rosette on a circle with a radius r=2$\lambda$ and a circumference of 2$\pi$r≈12 $\lambda$, where $\lambda$ is a characteristic wavelength. Beyond the circle of next-nearest neighbors, the instability decays with increasing distance. In the absence of nucleation effects, a similar argument also explains the hexagonal closest packing of the columns in FIG. 7c, where each maximum is surrounded by six neighbors, corresponding to a circle with radius $\lambda$ and circumference≈6 $\lambda$.

Another observation concerns the well-defined lateral length scale. The wavelength $\lambda$ is a function of electric field $E_p$, which varies inversely with the electrode spacing. The lateral structure dimensions as well as the plateau height is readily measured with the AFM yielding $\lambda$ as a function of electrode spacing d. In FIG. 5, $\lambda$ is plotted as a function of the electric field $E_p$ in the polymer layer. For a given film thickness h, the characteristic lateral structure size exhibits a power-law dependence as a function of the increasing electric field, corresponding to a decrease in the electrode spacing (top axis).

Example 2—Heterogeneous Fields

Figure 8:
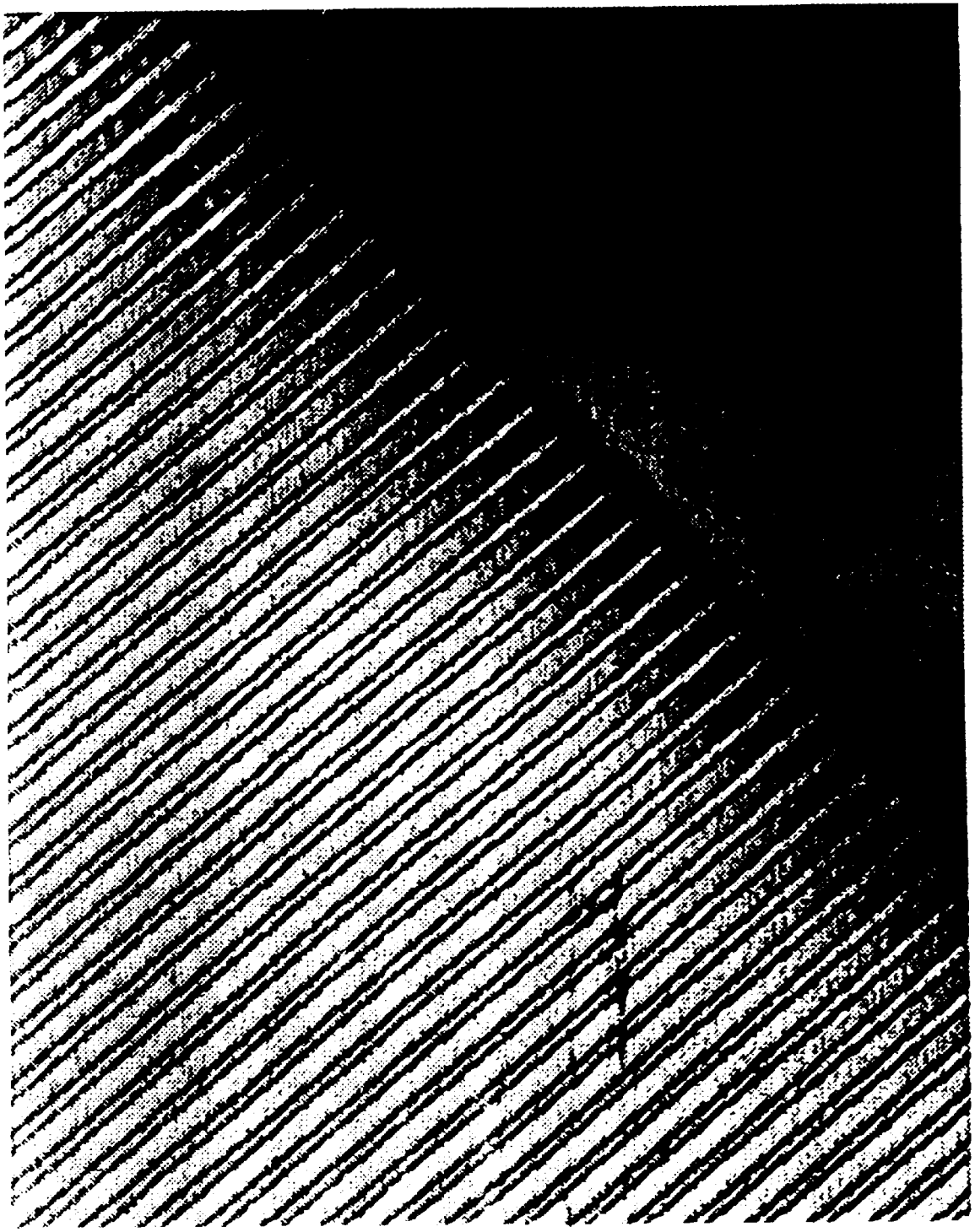
FIG. 8 is an optical micrograph of a polystyrene patterned film produced using a heterogeneous externally applied electric field.

A patterned electrode was mounted facing a brominated polystyrene film (h~45 nm), and the film was subjected to an applied voltage of 42 V. The device was maintained at 170° C. and exposed to the applied voltage for 20 hours. To ensure that no polymer remained on the master electrode after disassembly, the electrode was rendered unpolar by depositing of a self-assembled monolayer. FIG. 8 is an AFM image that shows 140 nm wide stripes (full-width half maximum), which replicate the silicon master electrode (200 nm stripes separated by 200 nm wide and 170 nm deep grooves). A cross-section measurement reveals a step height of 125 nm, with the resolution being limited by the geometry of the AFM tip. The profile of the polymer stripes is nearly rectangular with an aspect ratio of 0.83. The high quality of the replication extended over the entire 100×100 $\mu$m$^2$ area that was covered by the master pattern.

Example 3—Bilayer Liquids

Thin liquid films of polyisoprene (PI) and oligomeric styrene (OS) were spin-coated from toluene solutions onto bare and gold-coated silicon wafers, respectively. The film thickness was 140 nm. For some experiments, a small air gap was left above the liquid to form liquid/air bilayers. In the remaining experiments, the air was replaced with a layer of oligonieric dimethylsiloxane (ODMS), thus forming a liquid/liquid bilayer. No solvent was used to deposit the ODMS layer. The overall thickness of the bilayer was nominally 1 µm. Table 1 below summarizes the physical constants of the liquid oligomers and polymers. From the scientific literature, the interfacial tension of OS/ODMS, OS/PI and PI/ODMS are 6.1 mN/m, 1.68 mN/m and 3.2 mN/m, respectively. Thin rails of silicon oxide were evaporated on top of indium-tin-oxide (ITO)-coated microscope slides (Delta Techologies), and these slides were mounted on top of the bilayer samples with the ITO and silicon oxide side facing the bilayer samples. The separation distance between the substrate (Si wafer) and the upper boundary was thus controlled by the height of the evaporated spacers and was typically 1.08 µm. The samples were placed under an optical microscope and a small voltage (U=20 V for PI/air, PI/ODMS bilayer experiments and U=50 V for OS/air, OS/ODMS bilayer experiments) was applied between the Si substrate (electrode 1) and the ITO layer (electrode 2). As the ITO-coated substrates do not significantly absorb light in the visible range, this geometry permitted a direct observation of the temporal evolution of the thin liquid films in the electric field. In the first set of experiments, a layer of PI was placed between the electrodes, leaving an air gap of 940 nm. An amplification of fluctuations at the PI/air interface, occurred, ultimately leading to the creation of an array of vertically standing PI columns. The average distance between the center of two neighboring columns is $<d_{cyl-cyl}>=47.4\pm4.4$ µm.

The influence of changes in $\in$ and $\gamma$ of the upper layer on the time and size scales of the evolving structures was investigated in the second set of experiments involving a PI/ODMS bilayer annealed at ambient conditions. Again a cylinder structure results, but there is a clear reduction in length scale, associated with the replacement of air by ODMS. The cylinder structures now exhibit a typical spacing of $<d_{cyl-cyl}>=20.6\pm1.3$ µm. This spacing is about one-half that observed in the single film experiments. The characteristic times for the growth of the cylinders were determined for both the single and bilayers cases by optical microscopic observations. The time required to produce the first observable features was taken as the characteristic time. Notably, the time required to produce the cylindrical structures at the PI/ODMS interface was about one hour, nearly 50 times faster than the time needed to produce the columns in the single film case. Additional experiments on OS/air and OS/ODMS bilayers showed essentially the same behavior, with $<d_{cyl-cyl}>=12.7\pm2.8$ µm for OS/air and $<d_{cyl-cyl}>=7.6\pm2.9$ µm of OS/ODMS.

TABLE 1

|  | OS | PI | ODMS |
|---|---|---|---|
| $\gamma$ (mN/m) | 39 | 32 | 20 |
| $\epsilon$ | 2.5 | 2.37 | 2.93 |
| Mn | 580 | 40,000 | commercial grade |
| $\eta$ (Poise) | 15 | 400 | 0.1 |

Other Embodiments

It is to be understood that while the invention has been described in conjunction with the detailed description thereof, that the foregoing description is intended to illustrate and not limit the scope of the invention, which is defined by the scope of the appended claims. Other aspects, advantages, and modifications are within the scope of the following claims.

What is claimed is:

1. A method for forming a patterned film on a substrate, the method comprising:
   providing a first flowable medium on the substrate and a second flowable medium on the first flowable medium, the first and second flowable media having different dielectric properties and defining an interface there between;
   applying an electric field to the interface for a time sufficient to produce a structure in the first flowable medium along the interface; and
   hardening the structure in the first flowable medium to form the patterned film.

2. The method of claim 1, wherein the second flowable medium is a gas at any pressure.

3. The method of claim 1, wherein the second flowable medium is a liquid.

4. The method of claim 1, wherein the application of the electric field comprises laterally varying the strength of the electric field along the interface to define the structure.

5. The method of claim 4, further comprising providing the substrate with a laterally varying surface energy to further define the structure.

6. The method of claim 1, further comprising providing the substrate with a laterally varying surface energy to define the structure.

7. The method of claim 1, wherein the substrate comprises a lower electrode and the application of the electric field comprises applying a voltage across the lower electrode and an upper electrode spaced from the lower electrode by at least the first and second flowable media.

8. The method of claim 7, wherein at least one of the upper and lower electrodes have a topography that defines a laterally varying separation between the electrodes.

9. The method of claim 7, wherein at least one of the upper and lower electrodes comprises multiple, lateral regions having different conductivities.

10. The method of claim 7, wherein the substrate includes a layer of non-conductive material positioned between the lower electrode and the first flowable medium.

11. The method of claim 10, wherein the layer of non-conductive material comprises multiple, lateral regions having different dielectric properties.

12. The method of claim 7, wherein the upper electrode is spaced from the second flowable medium by a layer of non-conductive material.

13. The method of claim 12, wherein the layer of non-conductive material comprises multiple, lateral regions having different dielectric properties.

14. The method of claim 7, wherein the substrate comprises multiple, independently addressable lower electrodes.

15. The method of claim 7, wherein the application of the external electric field comprises generating multiple, potential differences between the lower electrode and multiple, independently addressable upper electrodes spaced from the lower electrode by at least the first and second flowable media.

16. The method of claim 1, wherein the first flowable medium is a liquid.

17. The method of claim 1, wherein the hardening comprises cooling the first flowable medium.

18. The method of claim 1, wherein the hardening comprises initiating a chemical reaction in the first flowable medium.

19. The method of claim 1, wherein the hardening comprises polymerizing the first flowable medium.

20. The method of claim 1, wherein the hardening comprises cross-linking the first flowable medium.

21. The method of claim 7 further comprising separating the upper electrode and the second flowable medium from the hardened lateral structure to reveal the patterned film.

22. The method of claim 1, further comprising repeating the providing, applying, and hardening steps to form a second patterned film on the substrate.

23. The method of claim 1, wherein the patterned film exposes selected regions of the substrate and the method further comprises removing a layer of the substrate at each of the exposed regions.

24. The method of claim 1, wherein the patterned film exposes selected regions of the substrate and the method further comprises depositing a layer of material at each of the exposed regions of the substrate.

25. A method for producing a pattern on multiple substrates, each of the multiple substrates having at least one lower electrode, the method comprising:

provyiding a master defining the pattern, the master comprising at least one upper electrode;

providing a first flowable medium on one of the substrates, positioning the master above the first flowable medium spaced from the first flowable medium by at least a second flowable medium, the first and second flowable media having different dielectric properties and defining an interface there between;

applying a voltage across at least one of the lower electrodes and at least one of the upper electrodes for a time sufficient to produce a structure in the first flowable medium along the interface;

hardening the lateral structure in the first flowable medium to form the pattern; and using the same master, repeating the providing step relating the first flowable medium, the positioning step, the applying step, and the hardening step for additional ones of the substrates.

26. A patterned film produced by the method of claim 1.

* * * * *

UNITED STATES PATENT AND TRADEMARK OFFICE
CERTIFICATE OF CORRECTION

PATENT NO. : 6,391,217 B2
DATED : May 21, 2002
INVENTOR(S) : Ullrich Steiner, Jürgen Mlynek, Thomas P. Russell, Erik Schäffer and Thomas Thurn-Albrecht It is certified that error appears in the above-identified patent and that said Letters Patent is hereby corrected as shown below:

Column 1,
Line 29, replace "exposed." with -- exposed, --.

Column 7,
Line 29, replace "$\epsilon$" with -- $\varepsilon$ --.
Line 30, replace "d" with -- $d$ --.
Line 33, replace "d" with -- $d$ --.
Line 33, replace "h" with -- $h$ --.
Line 33, replace "U" with -- $U$ --.
Line 53, replace "$\Delta\epsilon=\epsilon_1-\epsilon_2$" with -- $\Delta\varepsilon=\varepsilon_1-\varepsilon_2$ --.
Line 56, replace "$\Delta\epsilon=0$" to -- $\Delta\varepsilon=0$ --.

Column 8,
Line 1, replace "$\gamma_{max}$" with -- $\lambda_{max}$ --.
Line 14, replace "strongtest" with -- strongest --.
Line 14, replace "d" with -- $d$ --.
Line 16, replace "d" with -- $d$ --.

Column 9,
Line 32, replace "h" with -- $h$ --.
Line 36, replace "d" with -- $d$ --.
Line 40, replace "d" with -- $d$ --.
Line 47, replace "d" with -- $d$ --.
Line 47, replace "h" with -- $h$ --.
Line 49, replace "d" with -- $d$ --.

Column 10,
Line 11, replace "h" with -- $h$ --.
Line 37, replace "d" with -- $d$ --.
Line 39, replace "h" with -- $h$ --.
Line 47, replace "h" with -- $h$ --.

UNITED STATES PATENT AND TRADEMARK OFFICE
CERTIFICATE OF CORRECTION

PATENT NO.  : 6,391,217 B2
DATED       : May 21, 2002
INVENTOR(S) : Ullrich Steiner, Jürgen Mlynek, Thomas P. Russell, Erik Schäffer and Thomas Thurn-Albrecht It is certified that error appears in the above-identified patent and that said Letters Patent is hereby corrected as shown below:

Column 11,
Line 3, replace "oligonieric" with -- oligomeric --.
Line 32, replace "$\mathcal{C}$" with -- $\varepsilon$ --.
Line 57, replace "$\mathcal{C}$" with -- $\varepsilon$ --.

Column 14,
Line 2, replace "substrates," with -- substrates; --

Signed and Sealed this

Seventeenth Day of December, 2002

JAMES E. ROGAN
*Director of the United States Patent and Trademark Office*